(12) United States Patent
Shibata

(10) Patent No.: US 12,532,417 B2
(45) Date of Patent: Jan. 20, 2026

(54) WIRING CIRCUIT BOARD ASSEMBLY SHEET AND METHOD FOR PRODUCING WIRING CIRCUIT BOARD ASSEMBLY SHEET

(71) Applicant: NITTO DENKO CORPORATION, Osaka (JP)

(72) Inventor: Naoki Shibata, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 202 days.

(21) Appl. No.: 18/002,810

(22) PCT Filed: May 31, 2021

(86) PCT No.: PCT/JP2021/020758
§ 371 (c)(1),
(2) Date: Dec. 21, 2022

(87) PCT Pub. No.: WO2021/261178
PCT Pub. Date: Dec. 30, 2021

(65) Prior Publication Data
US 2023/0247770 A1    Aug. 3, 2023

(30) Foreign Application Priority Data
Jun. 25, 2020   (JP) ................ 2020-109973

(51) Int. Cl.
*H05K 3/28*    (2006.01)
(52) U.S. Cl.
CPC ..... *H05K 3/281* (2013.01); *H05K 2203/1545* (2013.01)
(58) Field of Classification Search
CPC .......... H05K 2201/09409; H05K 2201/09781; H05K 2203/1545; H05K 3/0097; H05K 3/242; H05K 3/281
See application file for complete search history.

(56) References Cited

U.S. PATENT DOCUMENTS

2003/0172526 A1* 9/2003 Komatsubara ......... H05K 3/108
                                                                  29/831
2005/0053868 A1   3/2005 Naito
(Continued)

FOREIGN PATENT DOCUMENTS

JP    2003-273498 A    9/2003
JP    2005-085944 A    3/2005
(Continued)

OTHER PUBLICATIONS

International Preliminary Report on Patentability issued by WIPO on Dec. 13, 2022, in connection with International Patent Application No. PCT/JP2021/020758.
(Continued)

*Primary Examiner* — Timothy J Thompson
*Assistant Examiner* — Rhadames Alonzo Miller
(74) *Attorney, Agent, or Firm* — Edwards Neils LLC; Jean C. Edwards, Esq.

(57) ABSTRACT

An assembly sheet as a wiring circuit board assembly sheet includes a substrate, a wiring pattern, and a dummy wiring pattern. The substrate includes a product region and a frame region adjacent to the product region. The wiring pattern is located on one side in a thickness direction of the substrate in the product region, and includes a first wiring and a second wiring thicker than the first wiring. The dummy wiring pattern is located on the one side in the thickness direction in the frame region, and includes a first dummy wiring and a second dummy wiring thicker than the first dummy wiring.

5 Claims, 7 Drawing Sheets

(56) References Cited

U.S. PATENT DOCUMENTS

| | | |
|---|---|---|
| 2005/0067293 A1 | 3/2005 | Naito et al. |
| 2006/0131064 A1 | 6/2006 | Hagiwara |
| 2009/0243087 A1* | 10/2009 | Nakamura ............ H01L 23/585 |
| | | 257/737 |
| 2010/0155113 A1 | 6/2010 | Kamei |
| 2010/0193225 A1* | 8/2010 | Abe ..................... H05K 3/4641 |
| | | 216/13 |
| 2012/0033395 A1* | 2/2012 | Ishii .................... H05K 3/0097 |
| | | 29/829 |
| 2019/0074125 A1* | 3/2019 | Yoshioka .............. H01F 27/292 |
| 2021/0185826 A1 | 6/2021 | Taniuchi et al. |
| 2021/0185832 A1 | 6/2021 | Sasaoka et al. |

FOREIGN PATENT DOCUMENTS

| | | |
|---|---|---|
| JP | 2005-108942 A | 4/2005 |
| JP | 2006-196878 A | 7/2006 |
| JP | 2008-147381 A | 6/2008 |
| JP | 2010-067317 A | 3/2010 |
| JP | 2010-147251 A | 7/2010 |
| JP | 2012-038914 A | 2/2012 |
| JP | 2019-153687 A | 9/2019 |
| JP | 2020-027848 A | 2/2020 |
| JP | 2020-027880 A | 2/2020 |

OTHER PUBLICATIONS

International Search Report issued in PCT/JP2021/020758 on Aug. 3, 2021.
Written Opinion issued in PCT/JP2021/020758 on Aug. 3, 2021.
Office Action, issued by the Taiwanese Intellectual Property Office on Nov. 5, 2024, in connection with Taiwanese Patent Application No. 110122564.

* cited by examiner

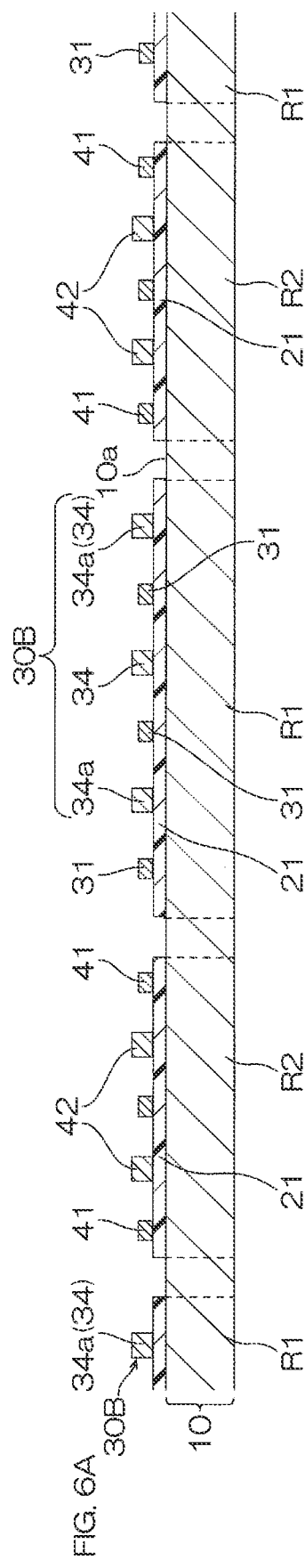
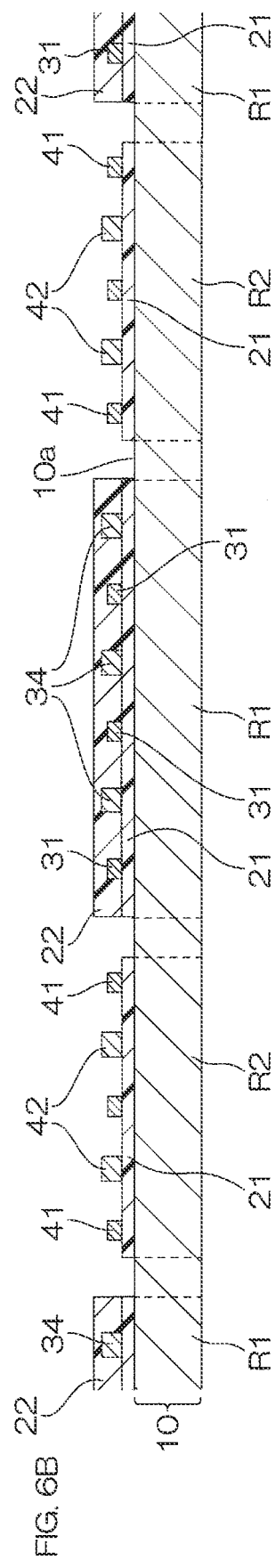
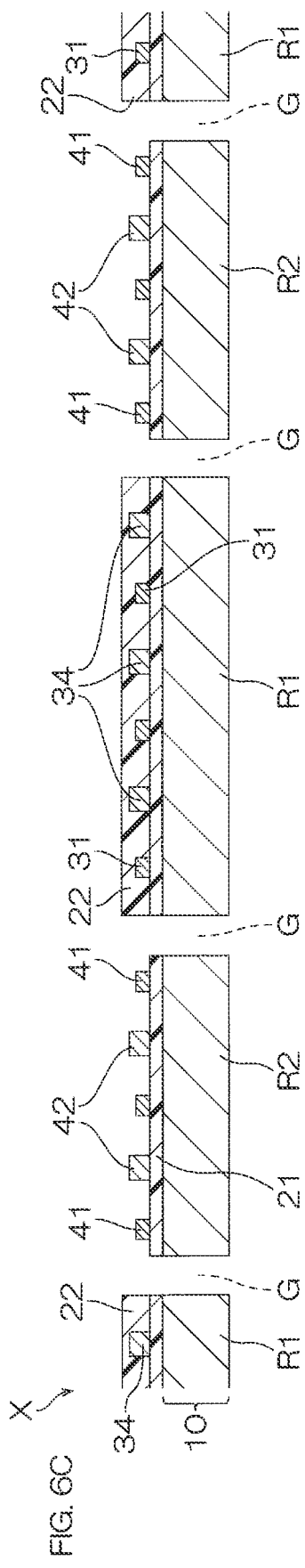

WIRING CIRCUIT BOARD ASSEMBLY SHEET AND METHOD FOR PRODUCING WIRING CIRCUIT BOARD ASSEMBLY SHEET

CROSS-REFERENCE TO RELATED APPLICATIONS

The present application is a 35 U.S.C. 371 National Stage Entry of PCT/JP2021/020758, filed on May 31, 2021, which claims priority from Japanese Patent Application No. 2020-109973, filed on Jun. 25, 2020, the contents of all of which are herein incorporated by reference in their entirety.

TECHNICAL FIELD

The present invention relates to a wiring circuit board assembly sheet and a method for producing a wiring circuit board assembly sheet.

BACKGROUND ART

In production of a wiring circuit board such as a suspension board with circuit which is assembled into a hard disk drive or the like, each step included in a production process thereof may be carried out in a so-called roll-to-roll method from the viewpoint of production efficiency. When the wiring circuit board is produced in the roll-to-roll method, a predetermined long substrate to which a wiring circuit forming process is applied is used, and an assembly sheet substantially including a plurality of wiring circuit boards is fabricated from the long substrate. For a technique relating to a method for producing a wiring circuit board in a roll-to-roll method is described in, for example, Patent Document 1 below.

CITATION LIST

Patent Document

Patent Document 1: Japanese Unexamined Patent Publication No. 2005-85944

SUMMARY OF THE INVENTION

Problem to be Solved by the Invention

In the production process of the wiring circuit board, a wiring pattern is formed in each product region of the substrate (portion to serve as a substrate of a single wiring circuit board by being separated from a frame region provided in the substrate). The wiring pattern is formed with a predetermined design thickness by a method, such as an additive method or a semi-additive method, including a step of depositing a conductive material for wiring pattern formation by a plating method.

However, conventionally, even a wiring pattern which is formed in a single wiring pattern forming step (including a single plating step) may have thickness variations in thicknesses of the wirings forming the wiring pattern. Specifically, in the wiring pattern formed in each product region, the wiring located at the outermost side (outermost wiring) may be thicker than the wiring located inside (inner wiring). In each product region, in the wiring pattern forming step, a wiring is not simultaneously formed at the further outside of the outermost wiring, and the outermost wiring has a smaller number of wirings simultaneously formed around it as compared with the inner wiring. Due to such a difference between the outermost wiring and the inner wiring, in the above-described plating step, in a plating solution to be used, the concentration of a conductive material near the outermost wiring is locally increased, and the outermost wiring has a greater deposition amount of the conductive material than the inner wiring. Therefore, the thicknesses of the wirings included in the wiring pattern to be formed vary.

On the other hand, the wiring circuit board may be required to have a wiring pattern including a plurality kinds of wirings having different thicknesses. In this case, it is required to suppress the above-described thickness variation for each kind of wiring having a predetermined design thickness in the wiring pattern.

The present invention provides a wiring circuit board assembly sheet suitable for forming a wiring pattern, while suppressing a thickness variation for each of a plurality kinds of wirings having different thicknesses, and a method for producing a wiring circuit board assembly sheet.

Means for Solving the Problem

The present invention [1] includes a wiring circuit board assembly sheet including a substrate including a product region and a frame region adjacent to the product region; a wiring pattern located on one side in a thickness direction of the substrate in the product region, and including a first wiring and a second wiring thicker than the first wiring; and a dummy wiring pattern located on the one side in the thickness direction in the frame region, and including a first dummy wiring and a second dummy wiring thicker than the first dummy wiring.

The wiring circuit board assembly sheet having such a configuration is suitable for suppressing a thickness variation of each of the first wirings and the second wirings by, in the production process thereof, separately carrying out a first step and a second step, where, in the first step the first wiring on the product region and the first dummy wiring on the frame region in the substrate are formed concurrently, and in a second step the second wiring, thicker than the first wiring, on the product region and the second dummy wiring, thicker than the first dummy wiring, on the frame region are formed concurrently.

Specifically, the first step is suitable for forming the first wiring on the product region, while forming the first dummy wiring on the frame region adjacent to the product region. The first dummy wiring is located further outside the first wiring at the outermost side of the first wirings formed on the product region (outermost first wiring). Such a first step is suitable for suppressing a local increase in the concentration of a conductive material at the outermost first wiring forming site and its vicinity, and suppressing a deposition amount of the conductive material of the outermost first wiring not much exceeding the deposition amount of the conductive material of the other first wiring(s) in a plating solution to be used when the conductive material for wiring formation is deposited in a plating method. Similarly, the above-described second step is suitable for forming the second wiring on the product region, while forming the second dummy wiring on the frame region adjacent to the product region which is located further outside the second wiring at the outermost side of the second wiring formed on the product region (outermost second wiring). Therefore, the above-described second step is suitable for suppressing a local increase in the concentration of the conductive material at the outermost second wiring forming site and its vicinity, and suppressing the deposition amount of the conductive material of the outermost second wiring not much exceeding the deposition amount of the conductive material of the other second wiring(s) in the plating solution to be used.

The present invention [2] includes the wiring circuit board assembly sheet described in the above-described [1], wherein the second wiring has a greater wiring width than the first wiring, and the second dummy wiring has a greater wiring width than the first dummy wiring.

Such a configuration is suitable for suppressing the thickness variation of each of the first wiring and the second wiring.

The present invention [3] includes the wiring circuit board assembly sheet described in the above-described [1] or [2], wherein the dummy wiring pattern includes a plurality of first dummy wirings extending along the product region and a plurality of second dummy wirings extending along the product region, and the first dummy wirings and the second dummy wirings are located alternately in a direction perpendicular to an extending direction of the first dummy wirings and the second dummy wirings.

Such a configuration is suitable for achieving both the equalization of the arrangement of the first dummy wiring and the equalization of the arrangement of the second dummy wiring in the frame region.

The present invention [4] includes the wiring circuit board assembly sheet described in any one of the above-described [1] to [3], wherein the dummy wiring pattern includes a portion where the first dummy wiring and the second dummy wiring are stacked with each other in the thickness direction.

Such a configuration is suitable for reducing the area for the dummy wiring pattern forming site in the frame region.

The present invention [5] includes a method for producing a wiring circuit board assembly sheet including a step of preparing a substrate including a product region and a frame region adjacent to the product region, a step of forming a first wiring on one side in a thickness direction of the substrate in the product region, while forming a first dummy wiring on the one side in the thickness direction in the frame region, and a step of forming a second wiring thicker than the first wiring on the one side in the thickness direction in the product region, while forming a second dummy wiring thicker than the first dummy wiring on the one side in the thickness direction in the frame region.

The present production method is suitable for forming a wiring pattern, while suppressing the thickness variation for each kind of wirings having different thicknesses for the same reason as described above with respect to the above-described wiring circuit board assembly sheet.

BRIEF DESCRIPTION OF THE DRAWINGS

FIG. 5A illustrating a preparing step,

FIG. 5B illustrating a first insulating layer forming step, and

FIG. 5C illustrating a first conductive layer forming step.

FIGS. 6A to 6C show steps subsequent to steps shown in FIGS. 5A to 5C:

FIG. 6A illustrating a second conductive layer forming step,

FIG. 6B illustrating a second insulating layer forming step, and

FIG. 6C illustrating a step of forming an opening portion in a metal substrate.

DESCRIPTION OF EMBODIMENTS

Figure 1:
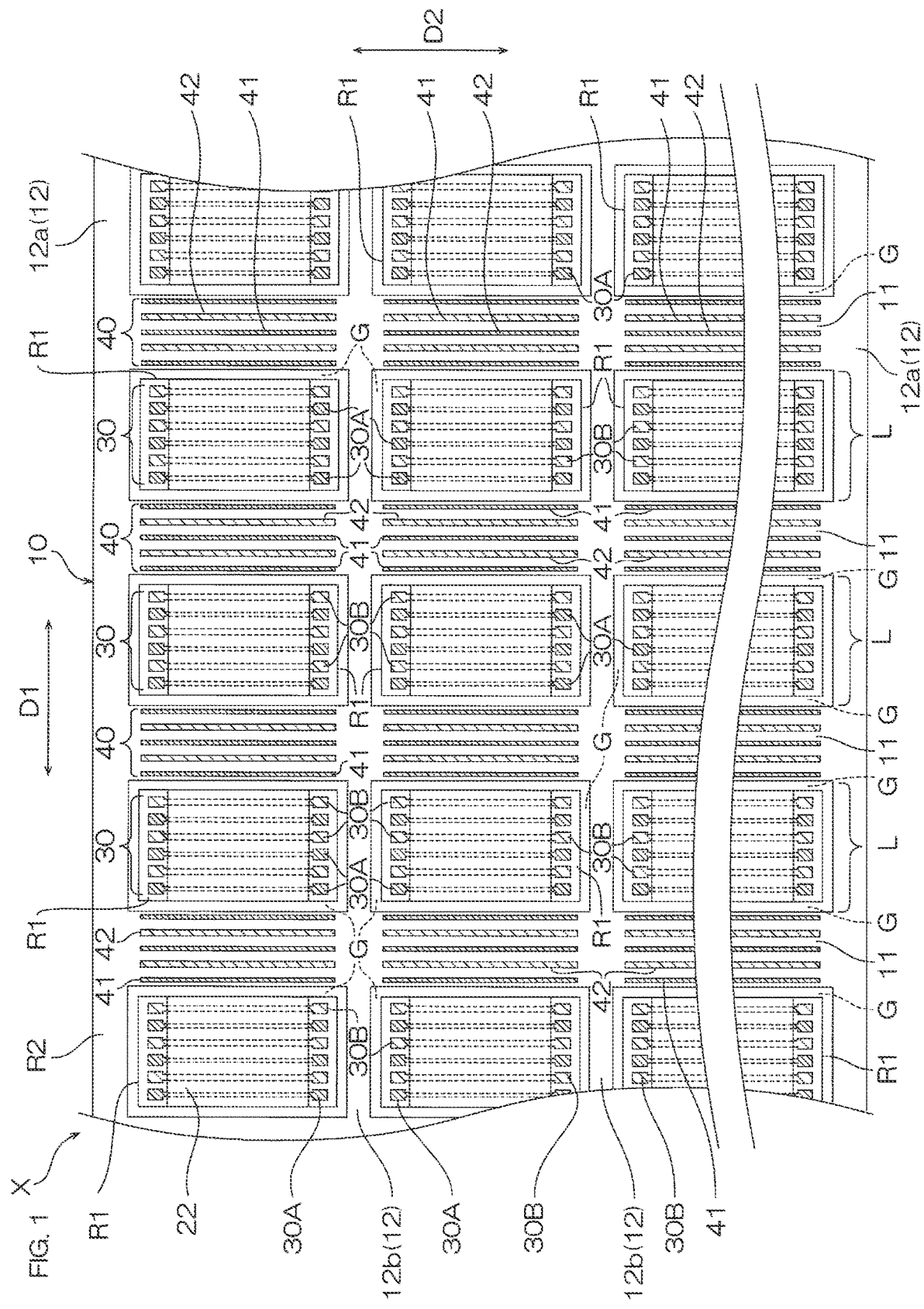
FIG. 1 shows a partially plan view of one embodiment of a wiring circuit board assembly sheet of the present invention.
Figure 2:
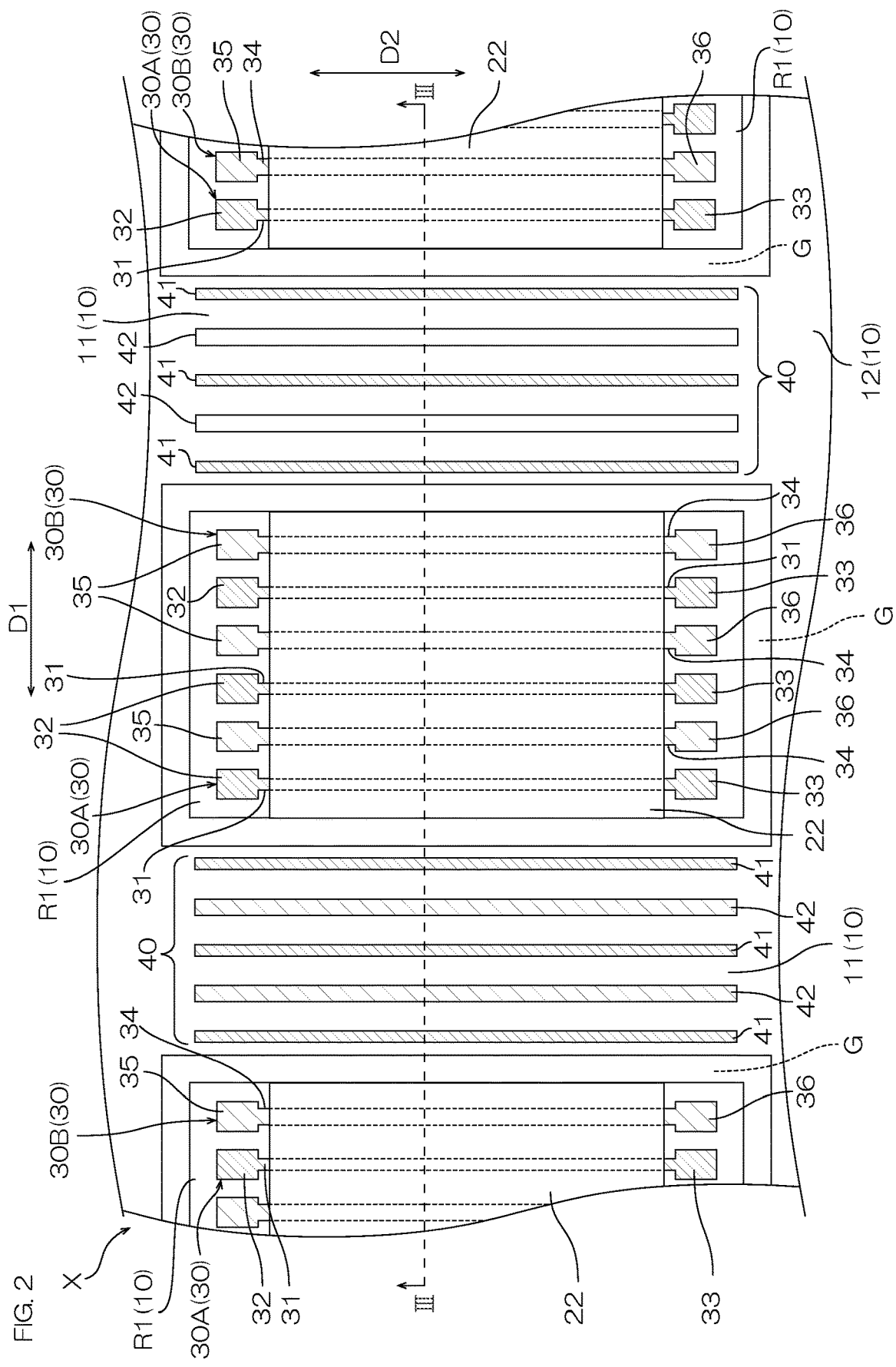
FIG. 2 shows a partially enlarged plan view of the wiring circuit board assembly sheet shown in FIG. 1.
Figure 3:
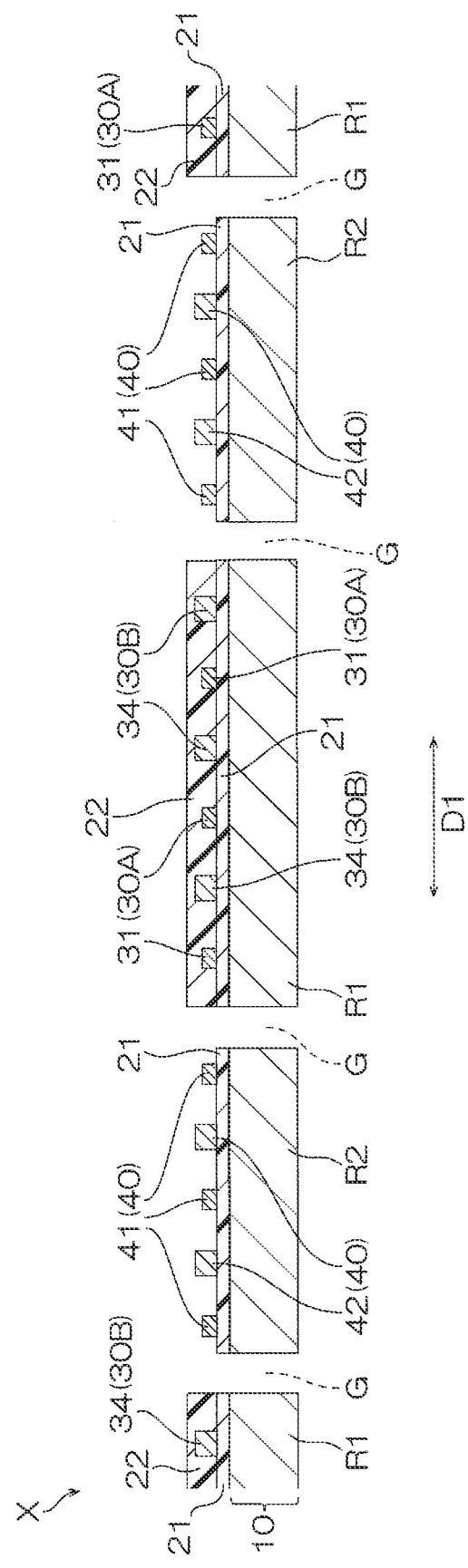
FIG. 3 shows a cross-sectional view of a III-III cross section shown in FIG. 2.

FIGS. 1 to 3 show an assembly sheet X which is one embodiment of a wiring circuit board assembly sheet of the present invention. FIG. 1 shows a partially plan view of the assembly sheet X. FIG. 2 shows a partially enlarged plan view of the assembly sheet X. FIG. 3 shows a cross-sectional view of a III-III cross section shown in FIG. 2 in the assembly sheet X.

The assembly sheet X includes a substrate 10, a base insulating layer 21, a cover insulating layer 22, a wiring pattern 30, and a dummy wiring pattern 40.

The substrate 10 is a flexible substrate made of metal in the present embodiment, and has a long sheet shape extending in one direction (first direction D1 shown in FIG. 1). A length of the substrate 10 in the first directional D1 is, for example, 1 to 500 m. The length (i.e., width) of the substrate 10 in a second direction D2 (width direction) perpendicular to the first direction D1 is, for example, 1 to 100 cm. A thickness (length in a direction perpendicular to the first direction D1 and the second direction D2) of the substrate 10 is, for example, 10 μm or more, preferably 15 μm or more, more preferably 50 μm or more, and for example, 500 μm or less, preferably 300 μm or less.

The substrate 10 includes a plurality of product regions R1 and a frame region R2 which forms a frame body around each product region RE In the substrate 10, each product region R1 and the frame region R2 are adjacent to each other, and are connected through a predetermined number of connecting portions (not shown). Each product region R1 is a portion which serves as a substrate of a single wiring circuit board by being separated from the frame region R2, and has a shape according to the design of the wiring circuit board as a production object when viewed from the top (in FIG. 1, illustratively illustrating a case where each product region R1 is rectangular when viewed from the top).

The plurality of product regions R1 are disposed in alignment in the substrate 10. In the present embodiment, the predetermined number of product regions R1 are disposed in one row spaced from each other in the second direction D2 to form a product region column L, and the plurality of product region columns L are disposed in parallel spaced from each other in the first direction DE The length in the first direction D1 of the product region R1 is, for example, 1 to 100 mm. The length in the second direction D2 of the product region R1 is, for example, 1 to 100 mm. The number of product regions R1 forming the product region column L is, for example, 1 to 500.

The frame region R2 includes a plurality of extending portions 11 (first extending portion) extending in the second direction D2 along the product region column L. Each extending portion 11 is adjacent to the product region R1 through an opening portion G in the first direction D1. In the present embodiment, the product region column L and the extending portion 11 are located alternately spaced from each other in the first direction D1. The length of the extending portion 11 in the first direction D1 (i.e., the width of the extending portion 11) is, for example, 0.1 to 50 mm. The length of the opening portion G between the product region R1 and the extending portion 11 in the first direction D1 (separation distance between the product region R1 and the extending portion 11) is, for example, 0.01 to 10 mm.

The frame region R2 includes a plurality of extending portions 12 (second extending portion) extending in the first direction D1. The plurality of extending portions 12 include two extending portions 12a located at both ends of the substrate 10 in the second direction D2, and an extending portion 12b located between the extending portions 12a. Each extending portion 12 is adjacent to the product region R1 through the opening portion G in the second direction D2. The length of the extending portion 12a in the second direction D2 (i.e., the width of the extending portion 12a) is, for example, 0.1 to 50 mm. The length of the extending portion 12b in the second direction D2 (i.e., the width of the extending portion 12b) is, for example, 0.1 to 50 mm. Preferably, the width of the extending portion 12a is greater than the width of the extending portion 12b. The length of the opening portion G between the product region R1 and the extending portion 12 in the second direction D2 (separation distance between the product region R1 and the extending portion 12) is, for example, 0.01 to 10 mm.

Examples of a material for the substrate 10 include metal foils. Examples of a metal material for the metal foil include copper, copper alloy, stainless steel, and 42-alloy. An example of the stainless steel includes SUS304 based on standards of AISI (American Iron and Steel Institute).

The base insulating layer 21 is, as shown in FIG. 3, located on one surface in a thickness direction of the substrate 10. The base insulating layer 21 is, in the present embodiment, provided over the entire product region R1 and frame region R2.

Examples of the material for the base insulating layer 21 include resin materials such as polyimide, polyether nitrile, polyether sulfone, polyethylene terephthalate, polyethylene naphthalate, and polyvinyl chloride (examples of the material for the cover insulating layer 22 to be described later include the same resin materials). The thickness of the base insulating layer 21 is, for example, 1 μm or more, preferably 3 μm or more, and for example, 35 μm or less, preferably 15 μm or less.

The wiring pattern 30 is located on one side in the thickness direction of the substrate 10 and on the base insulating layer 21 in each product region R1, and includes a first wiring pattern 30A and a second wiring pattern 30B.

The first wiring pattern 30A has a predetermined pattern shape on the base insulating layer 21, and as well shown in FIG. 2, includes a first wiring 31, a first terminal portion 32 located at one end thereof, and a second terminal portion 33 located at the other end of the first wiring 31 (illustratively illustrating an embodiment in which the first wiring 31 extends linearly in the second direction D2, and the first terminal portion 32 and the second terminal portion 33 are separated in the second direction D2).

The thickness of the first wiring 31 is, for example, 3 μm or more, preferably 5 μm or more, and for example, 50 μm or less, preferably 30 μm or less. The width of the first wiring 31 (dimension in a direction perpendicular to an extending direction of the first wiring 31) is, for example, 5 μm or more, preferably 8 μm or more, and for example, 100 μm or less, preferably 50 μm or less.

The thickness of the first terminal portion 32 and the second terminal portion 33 is the same as the thickness of the first wiring 31 in the present embodiment and is, for example, 3 μm or more, preferably 5 μm or more, and for example, 50 μm or less, preferably 30 μm or less. Each dimension of the first terminal portion 32 and the second terminal portion 33 in the extending direction (the second direction D2 in FIGS. 1 and 2) of the first wiring 31 is, for example, 10 μm or more, preferably 15 μm or more, and for example, 1500 μm or less, preferably 1000 μm or less. Each dimension of the first terminal portion 32 and the second terminal portion 33 in the width direction (the first direction D1 in FIGS. 1 and 2) of the first wiring 31 is preferably greater than the width of the first wiring 31, and is, for example, 10 μm or more, preferably 15 μm or more, and for example, 1000 μm or less, preferably 750 μm or less.

Examples of the material for the first wiring pattern 30A include conductive materials such as copper, nickel, gold, solder, and alloys of these, and preferably, copper is used (the same applies to the materials for the second wiring pattern 30B, a first dummy wiring 41, and a second dummy wiring 42 to be described later).

The second wiring pattern 30B has a predetermined pattern shape on the base insulating layer 21, and as well shown in FIG. 2, includes a second wiring 34, a third terminal portion 35 located at one end thereof, and a fourth terminal portion 36 located at the other end of the second wiring 34 (illustratively illustrating an embodiment in which the second wiring 34 extends linearly in the second direction D2, and the third terminal portion 35 and the fourth terminal portion 36 are separated in the second direction D2; and further illustratively illustrating an embodiment in which the first wiring pattern 30A and the second wiring pattern 30B are located alternately in parallel in the first direction D1).

The second wiring 34 is thicker than the first wiring 31. The thickness of the second wiring 34 is, for example, 4 μm or more, preferably 6 μm or more, and for example, 60 μm or less, preferably 40 μm or less as long as it is greater than the thickness of the first wiring 31. A ratio of the thickness of the second wiring 34 to the thickness of the first wiring 31 is, for example, 1.05 or more, preferably 1.1 or more, more preferably 1.2 or more, and for example, 10 or less, preferably 5 or less, more preferably 3 or less.

The width of the second wiring 34 (dimension in a direction perpendicular to the extending direction of the second wiring 34) is preferably greater than the width of the first wiring 31. That is, the second wiring 34 preferably has a greater wiring width than the first wiring 31. The width of the second wiring 34 is, for example, 6 μm or more, preferably 9 μm or more, and for example, 110 μm or less, preferably 60 μm or less. The ratio of the width of the second wiring 34 to the width of the first wiring 31 is, for example, 1.05 or more, preferably 1.1 or more, more preferably 1.2 or more, and for example, 10 or less, preferably 7.5 or less, more preferably 5 or less.

The thickness of the third terminal portion 35 and the fourth terminal portion 36 is the same as the thickness of the second wiring 34 in the present embodiment, and is, for example, 4 μm or more, preferably 6 μm or more, and for example, 60 μm or less, preferably 40 μm or less. Each dimension of the third terminal portion 35 and the fourth terminal portion 36 in the extending direction (the second direction D2 in FIGS. 1 and 2) of the second wiring 34 is, for example, 10 μm or more, preferably 15 μm or more, and for example, 1500 µm or less, preferably 1000 µm or less. Each dimension of the third terminal portion 35 and the fourth terminal portion 36 in the width direction (the first direction D1 in FIGS. 1 and 2) of the second wiring 34 is preferably greater than the width of the second wiring 34, and is, for example, 10 µm or more, preferably 15 µm or more, and for example, 1000 µm or less, preferably 750 µm or less.

In the wiring pattern 30, the separation distance (separation distance in the first direction D1 in FIGS. 1 and 2) between the first wiring 31 and the second wiring 34 adjacent to each other is, for example, 3 µm or more, preferably 5 µm or more, and for example, 500 µm or less, preferably 250 µm or less.

The cover insulating layer 22 is disposed on one surface in the thickness direction of the base insulating layer 21 so as to cover the first wiring 31 and the second wiring 34 for each product region R1, and has a predetermined pattern shape (illustratively illustrating a case where the cover insulating layer 22 is rectangular for each product region R1, and further, in FIGS. 1 and 2, a portion covered with the cover insulating layer 22 in the first wiring 31 and the second wiring 34 is shown by a broken line). The cover insulating layer 22 does not cover the first terminal portion 32, the second terminal portion 33, the third terminal portion 35, and the fourth terminal portion 36, and these terminal portions are exposed.

A height of the cover insulating layer 22 from the base insulating layer 21 (distance from the base insulating layer 21 to the upper end in FIG. 3 of the cover insulating layer 22) is, for example, 5 µm or more, preferably 7 µm or more, and for example, 70 µm or less, preferably 50 µm or less as long as it is greater than the thickness of the first wiring 31 and the second wiring 34.

The dummy wiring pattern 40 is located on one side in the thickness direction of the substrate 10 and on the base insulating layer 21 in the frame region R2, and includes the first dummy wiring 41 and the second dummy wiring 42. In the present embodiment, the dummy wiring pattern 40 is located on the extending portion 11 of the frame region R2. Specifically, each of the first dummy wiring 41 and the second dummy wiring 42 extends along the product region R1 in the second direction D2 on the extending portion 11. Further, the first dummy wiring 41 and the second dummy wiring 42 are separated and located alternately in the first direction D1, and disposed in parallel (illustratively illustrating an embodiment in which the three first dummy wirings 41 and the two second dummy wirings 42 are located alternately in parallel).

The first dummy wiring 41 is a conductive layer formed in parallel with the first wiring 31 as described later, and is associated with the first wiring 31. The first dummy wiring 41 is preferably electrically connected to the substrate 10 made of metal through a via (not shown) as an electrically conductive connecting portion penetrating the base insulating layer 21. Such a configuration is, in the production process of the assembly sheet X, suitable for forming a protective plating film such as a Ni plating film on the surface of the first dummy wiring 41 (surface not in contact with the base insulating layer 21) by an electrolytic plating method or an electroless plating method.

Further, the first wiring 31 and the first dummy wiring 41 are preferably electrically connected. It is possible to electrically connect the first wiring 31 to the first dummy wiring 41 through the substrate 10 made of metal. Specifically, a first electrically conductive connecting portion (not shown) which electrically connects the first wiring 31 to the substrate 10 is provided, and a second electrically conductive connecting portion (not shown) which electrically connects the first dummy wiring 41 to the substrate 10 is provided, so that it is possible to electrically connect the first dummy wiring 41 to the first wiring 31 through the substrate 10 made of metal (first electrically conductive connecting portion is cut in the production process of the wiring circuit board).

The design thickness of the first dummy wiring 41 is the same as the design thickness of the first wiring 31. The thickness of the first dummy wiring 41 is, for example, 3 µm or more, preferably 5 µm or more, and for example, 50 µm or less, preferably 30 µm or less. The width of the first dummy wiring 41 (dimension in a direction perpendicular to the extending direction of the first dummy wiring 41) is preferably the same as the width of the first wiring 31. The width of the first dummy wiring 41 is, for example, 5 µm or more, preferably 8 µm or more, and for example, 100 µm or less, preferably 50 µm or less.

The second dummy wiring 42 is a conductive layer formed in parallel with the second wiring 34 as described later, and is associated with the second wiring 34. The second dummy wiring 42 is preferably electrically connected to the substrate 10 made of metal through a via (not shown) as an electrically conductive connecting portion penetrating the base insulating layer 21. Such a configuration is, in the production process of the assembly sheet X, suitable for forming a protective plating film such as a Ni plating film on the surface of the second dummy wiring 42 (surface not in contact with the base insulating layer 21) by an electrolytic plating method or an electroless plating method.

Further, the second wiring 34 and the second dummy wiring 42 are preferably electrically connected. It is possible to electrically connect the second wiring 34 to the second dummy wiring 42 through the substrate 10 made of metal. Specifically, a third electrically conductive connecting portion (not shown) which electrically connects the second wiring 34 to the substrate 10 is provided, and a fourth electrically conductive connecting portion (not shown) which electrically connects the second dummy wiring 42 to the substrate 10 is provided, so that it is possible to electrically connect the second dummy wiring 42 to the second wiring 34 through the substrate 10 made of metal (third electrically conductive connecting portion is cut in the production process of the wiring circuit board).

The design thickness of the second dummy wiring 42 is the same as the design thickness of the second wiring 34. The second dummy wiring 42 is thicker than the first dummy wiring 41. The thickness of the second dummy wiring 42 is, for example, 4 µm or more, preferably 6 µm or more, and for example, 60 µm or less, preferably 40 µm or less. The ratio of the thickness of the second dummy wiring 42 to the thickness of the first dummy wiring 41 is, for example, 1.05 or more, preferably 1.1 or more, more preferably 1.2 or more, and for example, 10 or less, preferably 5 or less, more preferably 3 or less.

The width of the second dummy wiring 42 (dimension in a direction perpendicular to the extending direction of the second dummy wiring 42) is preferably the same as the width of the second wiring 34. The width of the second dummy wiring 42 is, for example, 6 µm or more, preferably 9 µm or more, and for example, 110 µm or less, preferably 60 µm or less. The ratio of the width of the second dummy wiring 42 to the width of the first dummy wiring 41 is, for example, 1.05 or more, preferably 1.1 or more, more preferably 1.2 or more, and for example, 10 or less, preferably 7.5 or less, more preferably 5 or less.

The separation distance between the first dummy wiring 41 and the second dummy wiring 42 adjacent to each other is, for example, 5 μm or more, preferably 10 μm or more, and for example, 1000 μm or less, preferably 500 μm or less.

Figure 4:
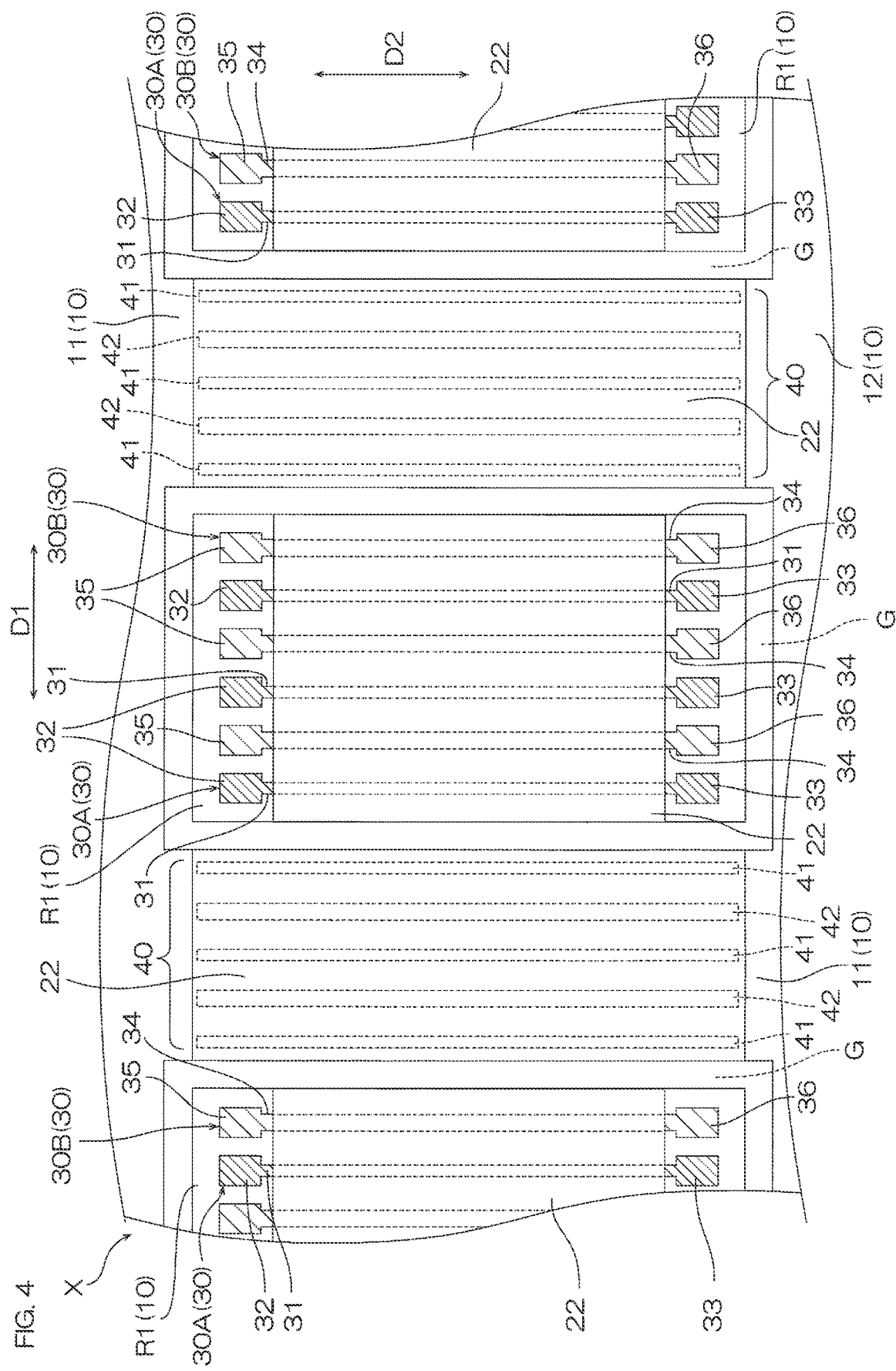
FIG. 4 shows a partially enlarged plan view of one modified example of the wiring circuit board assembly sheet shown in FIG. 1.

For example, as shown in FIG. 4, the above-described cover insulating layer 22 may be disposed on one surface in the thickness direction of the base insulating layer 21 so as to have a portion covering the first dummy wiring 41 and the second dummy wiring 42 (in FIG. 4, the first dummy wiring 41 and the second dummy wiring 42 covered with the cover insulating layer 22 are shown by the broken line).

The assembly sheet X having the above-described configuration may take a form of a roll in such a manner that the surface of the substrate 10 on which the wiring pattern 30 and the dummy wiring pattern 40 are formed is positioned on the outer diameter side. The assembly sheet X is transportable and storable in the form of the roll.

Figure 5A:
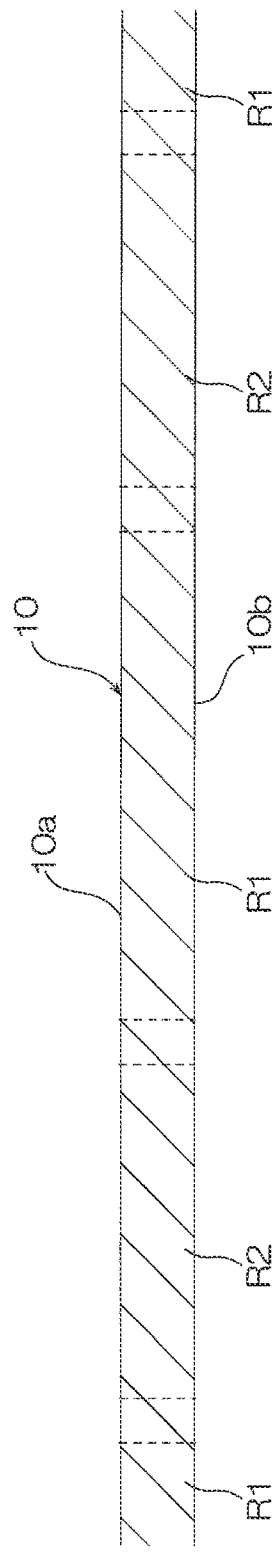
FIGS. 5A to 5C show a part of steps in a method for producing the wiring circuit board assembly sheet shown in FIG. 1 as a change in a cross section corresponding to FIG. 3.

FIGS. 5A and 6C show one example of a method for producing the assembly sheet X. FIGS. 5A and 6C show the present production method as a change in a cross section corresponding to FIG. 3. In the present production method, the following various processes and treatments are carried out in a roll-to-roll method with respect to the workpiece taking the form of the roll, thereby producing the assembly sheet X.

In the present production method, first, as shown in FIG. 5A, the unprocessed substrate 10 without the opening portion G is prepared (preparing step). The substrate 10 has a first surface 10a to be processed, and a second surface 10b facing away therefrom, and includes the product regions R1 and the frame regions R2 which are separated by the subsequent formation of the opening portions G and are adjacent to each other. In the this step, the substrate 10 is prepared in the form of the roll.

Figure 5B:
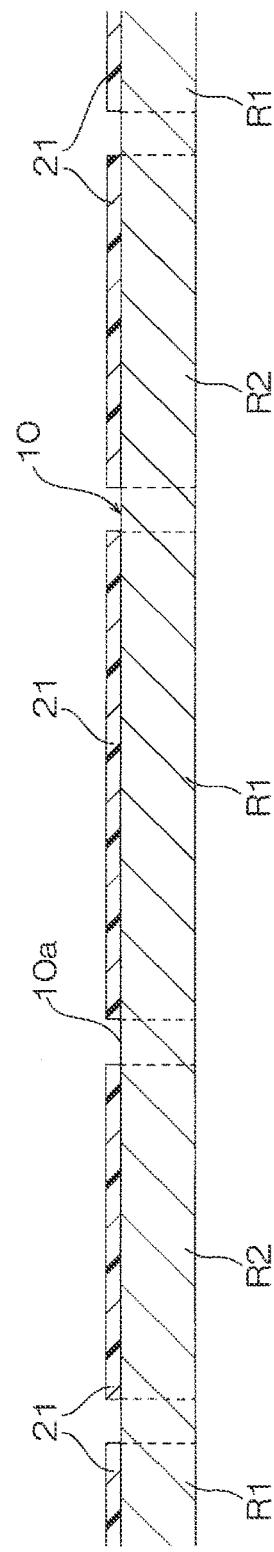

Next, as shown in FIG. 5B, the base insulating layer 21 is pattern-formed on the first surface 10a of the substrate 10 (first insulating layer forming step). In the this step, first, a solution (varnish) of a photosensitive resin is applied onto the first surface 10a of the substrate 10 to be dried, thereby forming a coating film. Next, the coating film on the substrate 10 is subjected to an exposure process through a predetermined mask, a subsequent development process, and thereafter, if necessary, a bake process. In this way, the base insulating layer 21 is formed on the product regions R1 and the frame regions R2 of the substrate 10.

Figure 5C:
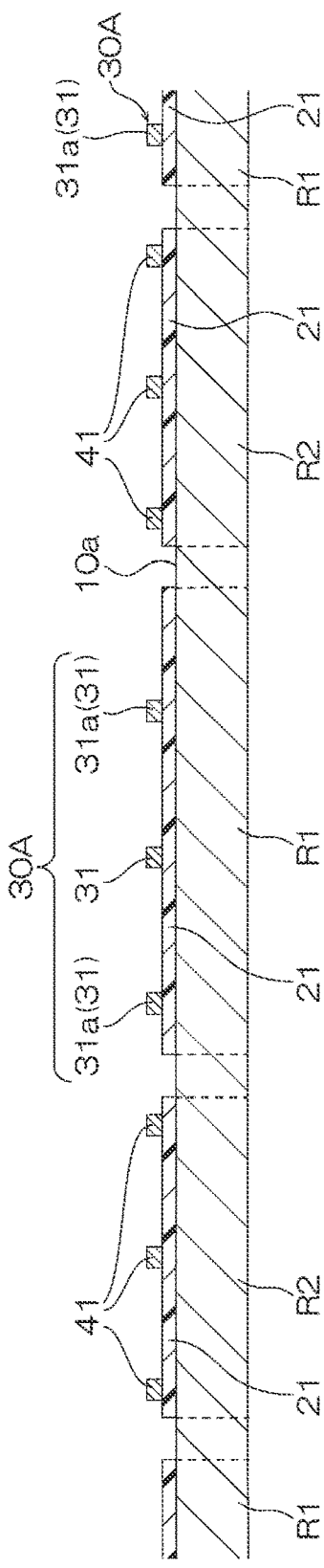

Next, as shown in FIG. 5C, the first wiring pattern 30A (the first wiring 31, the first terminal portion 32, the second terminal portion 33) and the first dummy wiring 41 are formed on the base insulating layer 21 (first conductive layer forming step: the first step). In the this step, the first wiring pattern 30A including the first wiring 31 is formed on one side in the thickness direction in the product region R1, while the first dummy wirings 41 are formed on one side in the thickness direction of the substrate 10 in the frame region R2.

Specifically, first, a seed layer is formed in, for example, a sputtering method so as to cover the first surface 10a of the substrate 10 and the base insulating layer 21 thereon. Examples of the material for the seed layer include Cr, Cu, Ni, Ti, and alloys of these (examples of the material for the seed layer to be described later include the same materials). Next, a resist pattern is formed on the seed layer. The resist pattern has an opening portion having a shape corresponding to a pattern shape of the first wiring pattern 30A and the first dummy wirings 41. In the formation of the resist pattern, for example, after a photosensitive resist film is attached onto the seed layer, a resist film is formed. Thereafter, the resist film is subjected to the exposure process through the predetermined mask, the subsequent development process, and thereafter, if necessary, the bake process (the same applies to the formation of the resist pattern to be described later). Next, a conductive material such as copper is deposited in the opening portion of the resist pattern using a plating solution by the electrolytic plating method. Next, the resist pattern is removed by etching. Next, a portion exposed by resist pattern removal in the seed layer is removed by the etching. As described above, it is possible to form the first wiring pattern 30A (the first wiring 31, the first terminal portion 32, the second terminal portion 33), and the first dummy wirings 41 concurrently.

In the this step, the first wiring 31 is formed on the product region R1, while the first dummy wirings 41 are formed on the frame region R2 adjacent to the product region R1 at the further outside of the first wiring 31 located at the outermost side of the first wirings 31 formed on the product region R1 (the outermost first wiring 31a). Such a step is suitable for suppressing a local increase in the concentration of the conductive material at the outermost first wiring 31a forming site and its vicinity, and suppressing a deposition amount of the conductive material of the outermost first wiring 31a not much exceeding the deposition amount of the conductive material of the other first wirings 31 in a plating solution used in the above-described electrolytic plating method. That is, the this step is suitable for forming the first wirings 31, while suppressing a thickness variation of the first wirings 31.

In the present production method, next, as shown in FIG. 6A, the second wiring pattern 30B (the second wiring 34, the third terminal portion 35, the fourth terminal portion 36) and the second dummy wiring 42 are formed on the base insulating layer 21 (second conductive layer forming step). In the this step, the second wiring pattern 30B which is thicker than the first wiring 31 and includes the second wiring 34 is formed on one side in the thickness direction in the product region R1, while the second dummy wirings 42 which are thicker than the first dummy wiring 41 are formed on one side in the thickness direction of the substrate 10 in the frame region R2.

Specifically, first, the seed layer is formed so as to cover the first surface 10a of the substrate 10, the base insulating layer 21 thereon, the first wiring pattern 30A, and the first dummy wirings 41 by, for example, a sputtering method. Next, a resist pattern is formed on the seed layer. The resist pattern has an opening portion having a shape corresponding to the pattern shape of the second wiring pattern 30B and the second dummy wirings 42. Next, the conductive material such as copper is deposited in the opening portion of the resist pattern by the electrolytic plating method. Next, the resist pattern is removed by the etching. Next, a portion exposed by the resist pattern removal in the seed layer is removed by the etching. As described above, it is possible to form the second wiring pattern 30B (the second wiring 34, the third terminal portion 35, the fourth terminal portion 36) and the second dummy wirings 42 concurrently.

In the this step, the second wiring 34 is formed on the product region R1, while the second dummy wirings 42 are formed on the frame region R2 adjacent to the product region R1 at the further outside of the second wiring 34 located at the outermost side of the second wirings 34 formed on the product region R1 (the outermost second wiring 34a). Such a step is suitable for suppressing the local increase in the concentration of the conductive material at the outermost second wiring 34a forming site and its vicinity, and suppressing the deposition amount of the conductive material of the outermost second wiring 34a not much exceeding the deposition amount of the conductive material of the other second wirings 34 in the plating solution used in the above-described electrolytic plating method. That is, the this step is suitable for forming the second wirings 34, while suppressing the thickness variation of the second wirings 34.

Next, as shown in FIG. 6B, the cover insulating layer 22 covering the wiring pattern 30 (the first wiring pattern 30A, the second wiring pattern 30B) is formed on the base insulating layer 21 (second insulating layer forming step). In the this step, first, the solution (varnish) of the photosensitive resin is applied to the first surface 10a side of the substrate 10 to be dried, thereby forming the coating film. Next, the coating film is subjected to the exposure process through the predetermined mask, the subsequent development process, and thereafter, if necessary, the bake process. In this way, it is possible to form the cover insulating layer 22 for each product region R1.

Next, as shown in FIG. 6C, the opening portions G are formed in the substrate 10. In the this step, the opening portions G are formed in the substrate 10 made of metal by the etching process through the predetermined etching mask with respect to the substrate 10. As the etching solution for the etching process, for example, ferric chloride is used.

For example, by undergoing the steps as described above, it is possible to produce the assembly sheet X. In the present production method, the second conductive layer forming step may be carried out before the first conductive layer forming step. In produced assembly sheet X, by cutting the above-described connecting portion (not shown) which connects between the predetermined product region R1 and the frame region R2, it is possible to disconnect the product region R1, as a wiring circuit board, from the assembly sheet X.

As described above, the assembly sheet X includes the substrate 10, the wiring pattern 30, and the dummy wiring pattern 40; the wiring pattern 30 is located on one side in the thickness direction of the product region R1 of the substrate 10, and includes the first wirings 31 and the second wirings 34 (thicker than the first wiring 31); and the dummy wiring pattern 40 is located on one side in the thickness direction of the frame region R2 of the substrate 10, and includes the first dummy wirings 41 and the second dummy wirings 42 (thicker than the first dummy wiring 41).

The assembly sheet X having such a configuration is suitable for suppressing the thickness variation of the first wirings 31 and the thickness variation of the second wirings 34 by, in the production process thereof, separately carrying out the first conductive layer forming step and the second conductive layer forming step as described above. In the first conductive layer forming step, the first wirings 31 on the product region R1 and the first dummy wirings 41 on the frame region R2 in the substrate 10 are formed concurrently. In the second conductive layer forming step, the second wirings 34 (thicker than the first wiring 31) on the product region R1 and the second dummy wirings 42 (thicker than the first dummy wiring 41) on the frame region R2 are formed concurrently. That is, the assembly sheet X is suitable for forming the wiring pattern 30, while suppressing the thickness variation for each of the plurality kinds of wirings having different thicknesses (the first wiring 31, the second wiring 34).

In the assembly sheet X, preferably, the second wiring 34 has a greater wiring width than the first wiring 31, and the second dummy wiring 42 has a greater wiring width than the first dummy wiring 41. Such a configuration is suitable for suppressing the thickness variation of the first wirings 31 and the thickness variation of the second wirings 34.

In the assembly sheet X, as described above, the dummy wiring pattern 40 includes the plurality of first dummy wirings 41 and the plurality of second dummy wirings 42 extending along the product region R1, and the first dummy wiring 41 and the second dummy wiring 42 are located alternately in a direction perpendicular to the extending direction of these (the first direction D1 in FIGS. 1 and 2). Such a configuration is suitable for achieving both the equalization of the arrangement of the first dummy wirings 41 and the equalization of the arrangement of the second dummy wirings 42 in the frame region R2.

The dummy wiring pattern 40 in the assembly sheet X may include a portion where the first dummy wiring 41 and the second dummy wiring 42 are stacked with each other in the thickness direction. Such a configuration is suitable for reducing the area for the dummy wiring pattern 40 forming site in the frame region R2. FIGS. 7A to 7F show variations of a laminate structure of the portion when the dummy wiring pattern 40 includes a portion where the first dummy wiring 41 and the second dummy wiring 42 are stacked in the thickness direction.

Figure 7A:
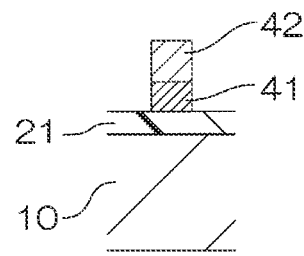
FIGS. 7A to 7F show partially cross-sectional views of modified examples of a wiring circuit board assembly sheet in which a dummy wiring pattern of each modified example has a form where a first dummy wiring and a second dummy wiring are stacked in a thickness direction.
Figure 7B:
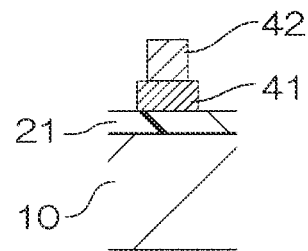

In the examples shown in FIGS. 7A and 7B, the first dummy wiring 41 is located on one surface in the thickness direction of the base insulating layer 21, and the second dummy wiring 42 is located on one surface in the thickness direction of the first dummy wiring 41. In the example shown in FIG. 7A, the width of the portion located on the first dummy wiring 41 in the second dummy wiring 42 is the same as the width of the first dummy wiring 41. In the example shown in FIG. 7B, the width of the portion located on the first dummy wiring 41 in the second dummy wiring 42 is smaller than the width of the first dummy wiring 41.

Figure 7C:
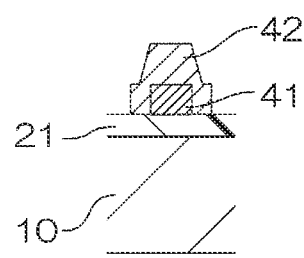

In the example shown in FIG. 7C, the first dummy wiring 41 is located on one surface in the thickness direction of the base insulating layer 21, and the second dummy wiring 42 is stacked on the first dummy wiring 41 so as to cover the first dummy wiring 41 on one side in the thickness direction of the base insulating layer 21.

Figure 7D:
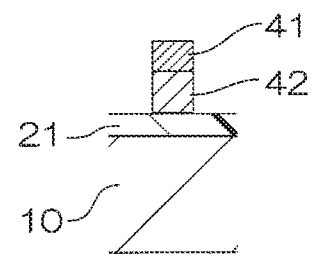
Figure 7E:
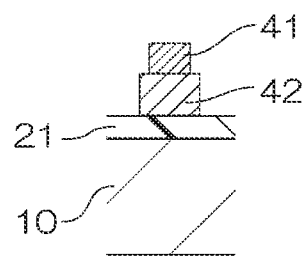

In the examples shown in FIGS. 7D and 7E, the second dummy wiring 42 is located on one surface in the thickness direction of the base insulating layer 21, and the first dummy wiring 41 is located on one surface in the thickness direction of the second dummy wiring 42. In the example shown in FIG. 7D, the width of the portion located on the second dummy wiring 42 in the first dummy wiring 41 is the same as the width of the second dummy wiring 42. In the example shown in FIG. 7E, the width of the portion located on the second dummy wiring 42 in the first dummy wiring 41 is smaller than the width of the second dummy wiring 42.

Figure 7F:
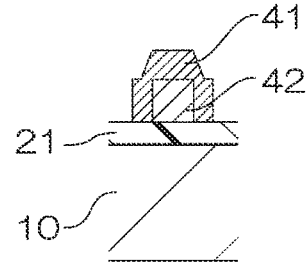

In the example shown in FIG. 7F, the second dummy wiring 42 is located on one surface in the thickness direction of the base insulating layer 21, and the first dummy wiring 41 is stacked on the second dummy wiring 42 so as to cover the second dummy wiring 42 on one side in the thickness direction of the base insulating layer 21.

INDUSTRIAL APPLICATION

The wiring circuit board assembly sheet of the present invention can be, for example, used for an assembly sheet of a wiring circuit board such as a suspension board with circuit.

DESCRIPTION OF REFERENCE NUMERALS

X Assembly sheet (wiring circuit board assembly sheet)
10 Substrate
R1 Product region
R2 Frame region
21 Base insulating layer
22 Cover insulating layer
30 Wiring pattern
31 First wiring
34 Second wiring
40 Dummy wiring pattern
41 First dummy wiring
42 Second dummy wiring

The invention claimed is:

1. A wiring circuit board assembly sheet comprising:
a substrate including a product region and a frame region adjacent to the product region;
a base insulating layer located on one surface in a thickness direction of the substrate;
a first wiring located on one surface in the thickness direction of the base insulating layer in the product region;
a second wiring disposed together with the first wiring on the one surface in the thickness direction of the base insulating layer in the product region and being thicker than the first wiring;
a first dummy wiring located on the one surface in the thickness direction of the base insulating layer in the frame region; and
a second dummy wiring disposed together with the first dummy wiring on the one surface in the thickness direction of the base insulating layer in the frame region and being thicker than the first dummy wiring.

2. The wiring circuit board assembly sheet according to claim 1, wherein the second wiring has a greater wiring width than the first wiring, and the second dummy wiring has a greater wiring width than the first dummy wiring.

3. The wiring circuit board assembly sheet according to claim 1, wherein a plurality of first dummy wirings and a plurality of second dummy wirings extend along the product region, and the first dummy wirings and the second dummy wirings are located alternately in a direction perpendicular to an extending direction of the first dummy wirings and the second dummy wirings.

4. The wiring circuit board assembly sheet according to claim 1, wherein the first dummy wiring and the second dummy wiring are stacked with each other in the thickness direction.

5. A method for producing a wiring circuit board assembly sheet comprising:
a step of preparing a substrate including a product region and a frame region adjacent to the product region,
a step of forming a first wiring on one side in a thickness direction of the substrate in the product region, while forming a first dummy wiring on the one side in the thickness direction in the frame region, and
a step of forming a second wiring thicker than the first wiring on the one side in the thickness direction in the product region, while forming a second dummy wiring thicker than the first dummy wiring on the one side in the thickness direction in the frame region.

* * * * *